United States Patent [19]

Kurita et al.

[11] 4,229,514
[45] Oct. 21, 1980

[54] PHOTOSENSITIVE COMPOSITION

[75] Inventors: Yoshio Kurita, Hino; Akio Iwaki, Hachioji, both of Japan

[73] Assignee: Konishiroku Photo Industry Co., Ltd., Tokyo

[21] Appl. No.: 974,431

[22] Filed: Dec. 29, 1978

Related U.S. Application Data

[63] Continuation of Ser. No. 818,728, Jul. 25, 1977, abandoned.

[51] Int. Cl.³ .......................... G03C 1/52; G03C 1/68
[52] U.S. Cl. .................................... 430/195; 430/270; 430/287; 204/159.11; 204/159.14; 204/159.22
[58] Field of Search .................. 96/115 R, 91 N; 260/470 A; 430/195, 270, 287; 204/159.11, 159.14, 159.22

[56] References Cited

U.S. PATENT DOCUMENTS

| | | | |
|---|---|---|---|
| 3,257,664 | 6/1966 | Leubner et al. | 96/115 R |
| 3,594,348 | 7/1971 | Maar et al. | 96/115 R |
| 3,902,906 | 9/1975 | Iwama et al. | 96/105 R |
| 4,041,017 | 8/1977 | Maekawa et al. | 96/115 R |

OTHER PUBLICATIONS

Abstract, Journal of National Chem. Laboratory for Industry 68(3) 90 (1973).

*Primary Examiner*—Jack P. Brammer
*Attorney, Agent, or Firm*—Haseltine, Lake & Waters

[57] ABSTRACT

A composition containing a photosensitive polymer which becomes insoluble by a light exposure and particularly to a highly photosensitive composition which comprises a photosensitive polymer having in the structure as photosensitive groups both an a,B-unsaturated ketone group having a cyano group at the a-position and an azide group.

13 Claims, No Drawings

PHOTOSENSITIVE COMPOSITION

This is a Rule 60 Continuation of U.S. patent application Ser. No. 818,728, filed July 25, 1977 now abandoned.

This invention relates to a composition containing a photosensitive polymer which becomes insoluble by a light exposure and particularly to a highly photosensitive composition which comprises a photosensitive polymer having in the structure as photosensitive groups both an $\alpha,\beta$-unsaturated ketone group having a cyano group at the $\alpha$-position and an azide group. Azide compounds release nitrogen gas on photolysis to form nitrene which is a free radical. It is known that when a photosensitive polymer having introduced thereinto a large number of azide groups is exposed to an actinic light, the exposed portion of the polymer undergoes a photo-crosslinking reaction to become insoluble in aqueous alkali solutions or organic solvents, because nitrene brings about a dehydrogenation reaction, an addition reaction to double bond and a coupling reaction of nitrene itself.

It is further known that since an $\alpha,\beta$-unsaturated ketone group dimerizes by exposure to an actinic light to form a 4-membered ring, an $\alpha,\beta$-unsaturated ketone containing polymer is made insoluble in solvents by subjecting the polymer to photo-crosslinkage. Utilizing such property, a photosensitive material having coated, on a suitable support, a photosensitive composition containing such an azide compound or an $\alpha,\beta$-unsaturated ketone compound as a photosensitive component is imagewise exposed and the unexposed portion of the composition is dissolved and removed by development treatment using an aqueous alkali solution or an organic solvent, thereby obtaining a relief image of negative type corresponding to the image of original. The resulting relief image is utilized in an offset printing plate, a letterpress printing plate, a wash off film, a name plate and the like. Further, the relief image is utilized in the preparation of a photogravure plate, a printed circuit substrate and the like by using the relief image as a resist and etching the substrate thereof.

Heretofore, there have been known various polymers having azide or $\alpha,\beta$-unsaturated ketone groups as photosensitive groups. For instance, polyvinyl azidobenzoate and polyvinyl cinnamate are known as the polymer of this kind. However, these compounds themselves are low in sensitivity, so that sensitizers are required to be used in combination therewith in order to put them to practical use.

Further, such photosensitive compositions having azidocinnamic groups as disclosed, for example, in Journal of Polymer Science, part B, Vol. 9, pp. 81–83 (1971) and part A-1, Vol. 10, pp. 2379–2387 (1972) and photosensitive polymer having cinnamilidene acetic acid groups as disclosed, for example, in U.S. Pat. No. 3,257,664 are known to have enhanced sensitivities. In either case, however, there is involved such drawback that these compositions or compounds are low in storage stability. Photosensitive polymer having $\alpha$-cyanocinnamic acid groups as photosensitive groups disclosed in U.S. Pat. No. 2,824,084 are excellent so far as storage stability is concerned, but are inferior in sensitivity to those having azido-$\alpha$-cyanocinnamic acid groups.

Accordingly, photosensitive polymer having as photosensitive groups both an $\alpha,\beta$-unsaturated ketone group (which has a cyano group at the $\alpha$-position) and an azide group are characterized in that they are excellent in storage stability and high in sensitivity, and polyvinyl-p-azido-$\alpha$-cyanocinnamate is known as the compound of this kind (Journal of The National Chemical Laboratory for Industry, Vol. 68, pp. 90–94, 1973).

This photosensitive polymer, however, is an esterified compound by a reaction between an alcoholic hydroxyl group and p-azido-$\alpha$-cyanocinnamic acid chloride, and hence such the compound has to be developed with an organic solvent and requires the introduction thereinto of an alkali-soluble component in order to carry out development with an aqueous alkaline solution. In this case, the compound having introduced thereinto a component copolymerized with an acrylic acid or the like as the alkali-soluble component has such drawbacks that at the time of development with an aqueous alkaline solution, swelling of a relief is high and degradation of adhesivity is brought about.

An object of the present invention is to provide photosensitive polymer free from the above-mentioned drawbacks, high speed photosensitive polymer and photosensitive compositions excellent in physical, chemical and imagewise properties when said photosensitive polymer are used therein.

The present inventors have found that the abovementioned object is accomplished by the use of a photosensitive composition containing a photosensitive polymer having, in the molecular structure, a structural unit of the following general formula (I) (hereinafter called "the present polymer"):

General formula (I)

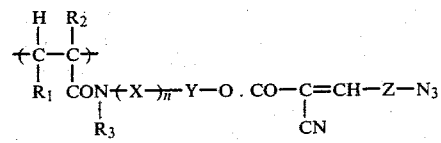

wherein $R_1$ represents hydrogen an alkyl group or carboxyl; $R_2$ represents hydrogen, halogen or an alkyl group; $R_3$ represents hydrogen, an alkyl group, an aryl group or an aralkyl group; Y and Z individually represent an arylene group; X represents a divalent organic group connecting the nitrogen atom to the aromatic ring carbon atom of Y; and n represents 0 or 1.

An aryl group and an aralkyl group for $R_3$ are preferably phenyl and benzil respectively. An arylene group for Y and Z is preferably phenylene or naphthylene, which phenylen for Y may be substituted with cyano, methyl and/or methoxy while the naphthylene for Y may be substituted with a sulfonic acid. The phenylene or naphthylene for Z may be substituted with nitro and/or chlorine. An alkyl group for $R_2$ and $R_3$ is preferably methyl or ethyl. Halogen for $R_2$ is preferably chlorine or bromine. A divalent group for X is an alkylene group preferably, especially methylene or ethylene.

The present polymer is high in sensitivity, favorable in storage stability and further excellent in a film-forming property and, moreover, has physical properties required for resin with excellent mechanical strength. Further, the present polymer has excellent adhesivity to various kinds of supports. The photosensitive composition containing the present photosensitive polymer has such advantages that the composition may be developed with either an organic solvent or a dilute aqueous alkaline solution depending on introduction ratio of a p-azido-$\alpha$-cyanocinnamoyl group into the structure of said photosensitive polymer and, moreover, the swelling thereof at the time of development is extremely small. For such reasons, the said photosensitive composition has such desirable characteristic features that resist strength is markedly large and the adhesion between the resist and support is strong. Particularly, when this composition is used as a resist for letterpress printing, a film-hardening step after development treatment and a burning treatment step may be omitted.

When the present photosensitive composition is used for offset printing, because of improved resist strength, resistance to printing of the composition has been markedly improved as compared with the prior art compositions. Furthermore, because of excellent resistance to an etching solution, non-etching portion of the present composition is hardly damaged when the composition is used in the preparation of a letterpress printing plate, an intaglio printing plate, a name plate, a printed circuit board, etc.

The polymer of the present invention is characterized in having in the molecular structure a structural unit of the aforementioned general formula (I). The polymer includes a homopolymer type structure comprising only said structural unit as a repeating structure or a copolymer type structure comprising as a repeating structure a combination of said structural unit and another structural unit in which an unsaturated double bond of a vinyl type monomer has been cleaved. The structural unit which may be used in combination with the structural unit of the aforementioned general formula (I) in the copolymer may includes a structural unit having hydroxyl in place of the —OCO—(CN)=CH—Z—N$_3$ in the formula (I) and other structural units in which an unsaturated double bond of another vinyl monomer has been cleaved, said another monomer including, for example, such ethylenic unsaturated olefins as ethylene, propylene, butylene, isobutylene and butadiene; styrenes such as styrene, α-methylstyrene and p-chlorostyrene; an acrylic acid; a methacrylic acid; an itaconic acid; a maleic acid; maleic anhydride; such esters as methyl acrylate, ethyl acrylate, n-butyl acrylate, isobutyl acrylate, dodecyl acrylate, n-octyl acrylate, 2-chloro-ethyl acrylate, phenyl acrylate, methyl α-chloroacrylate, methyl methacrylate, ethyl methacrylate, butyl methacrylate and ethyl methacrylate; acrylonitrile; methacrylonitrile; acrylamide; methacrylamide; α-ethylacrylamide; acrylanilide; p-chloroallylanilide; m-nitroacrylanilide; m-methoxyacrylanilide; vinyl ethers such as vinyl methyl ether, vinyl ethyl ether and vinyl isobutyl ether; vinyl esters such as vinyl acetate, vinyl opionate, vinyl benzoate and vinyl lactate; vinyl chloride; vinylidene chloride, vinylidene cyanide; ethylene derivatives such as 1-methyl-1'-methoxyethylene, 1,1'-dimethoxyethylene, 1,2-dimethoxyethylene, 1,1'-dimethoxycarbonylethylene and 1-methyl-1'-nitroethylene; and N-vinyl compounds such as N-vinylindole, N-vinyl pyrrolidene and N-vinylpyrrolidone. In the structural unit of the aforementioned general formula (I) of the present polymer, Y may be phenylene which may have substituent or naphthylene which may have a substituent. In this case, however, since the characteristic properties of the present high molecular compound are hardly affected by the kind of substituent, there may be used any substituents. Typical examples of the substituent may include, for example, an alkyl group, an alkoxy group, halogen, acyl, hydroxyl, carboxyl, a sulfonic acid, cyano and nitro.

Typical examples of the polymer of the present invention are exemplified below. In the following exemplified compounds, "Mn" represents an average molecular weight, and l:m:n or m:n represents the mole ratio of their respective structural units.

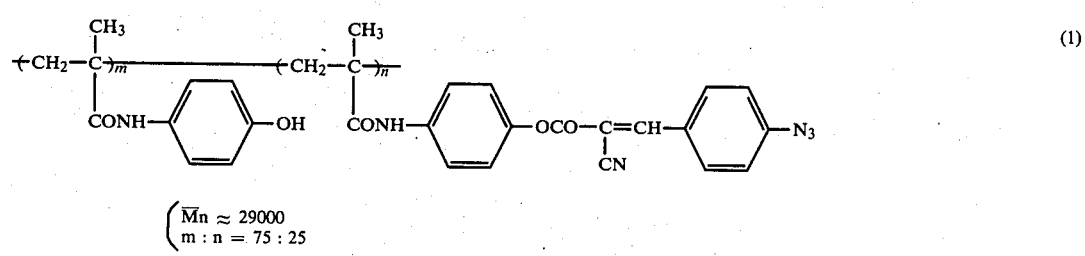

(1)

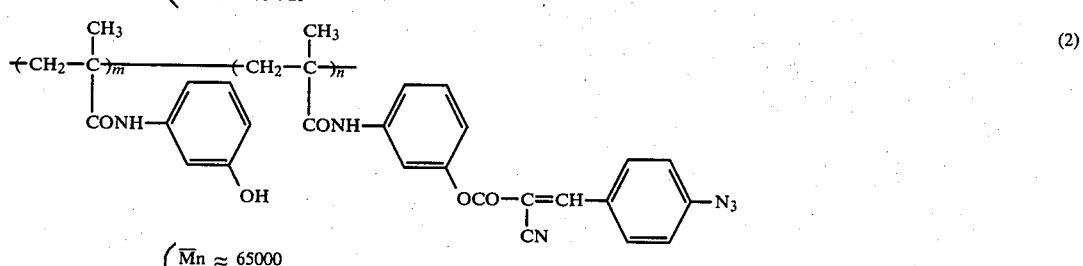

(2)

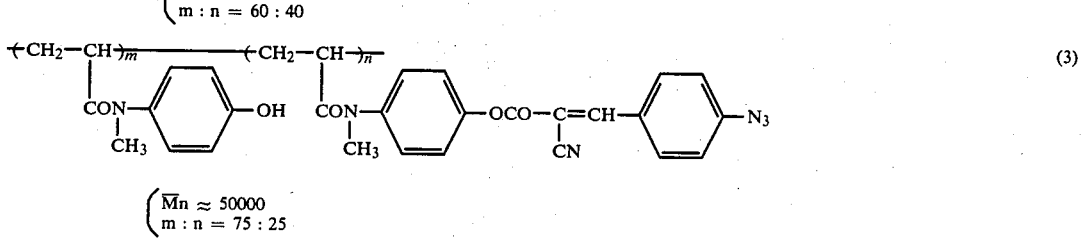

(3)

-continued
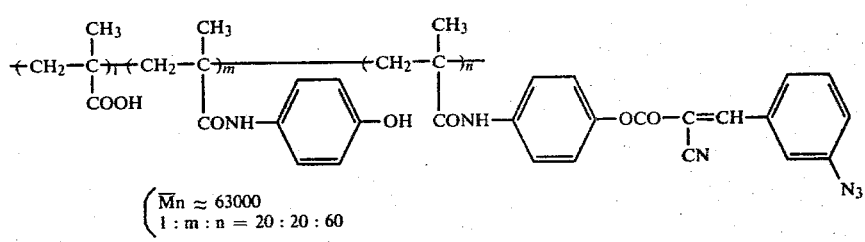
(4)
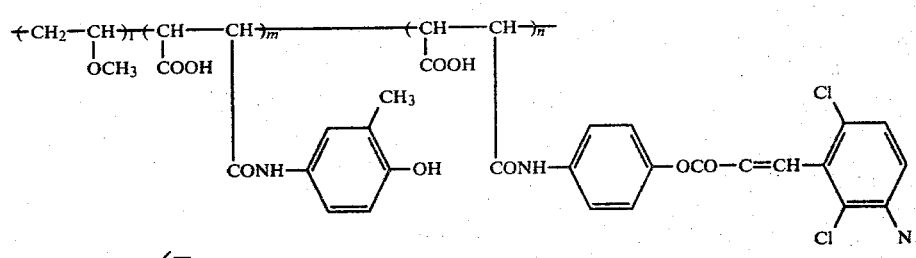
(5)
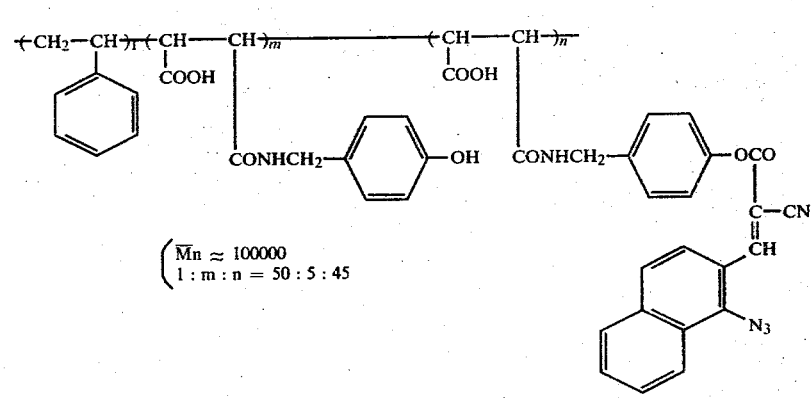
(6)
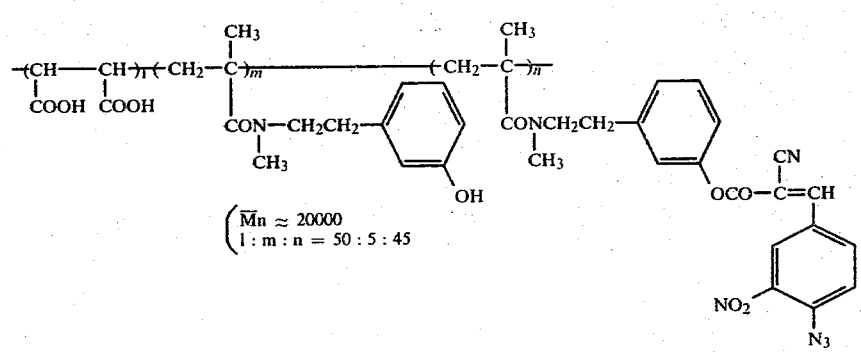
(7)
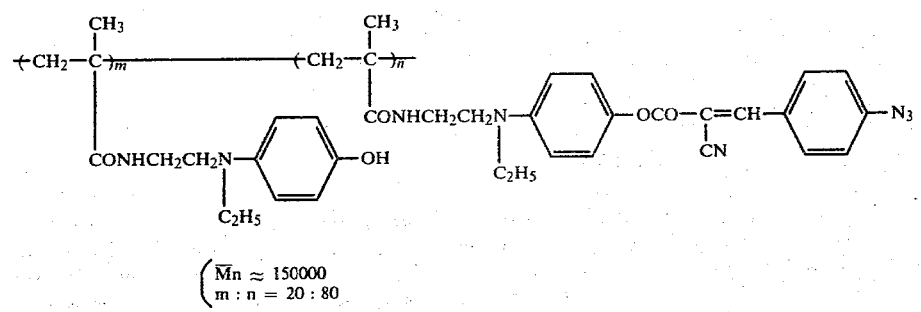
(8)

-continued

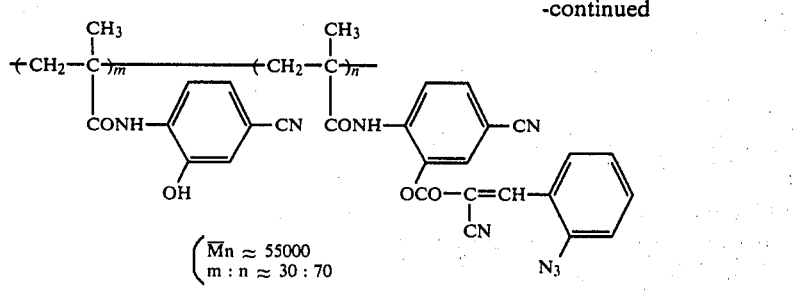
(9)

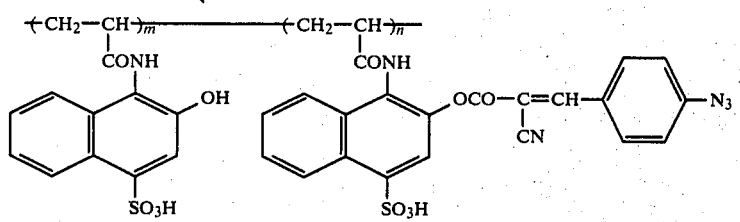
(10)

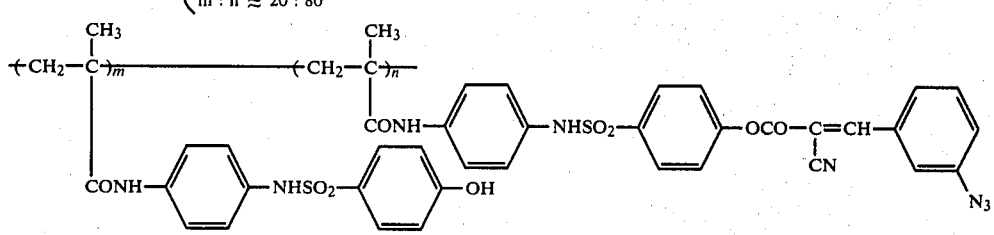
(11)

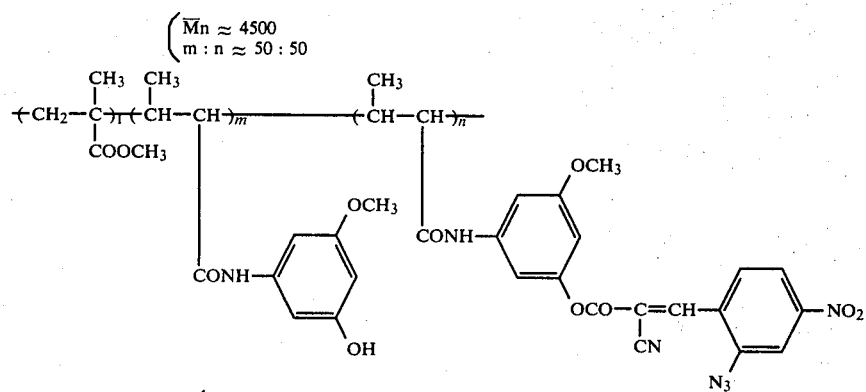
(12)

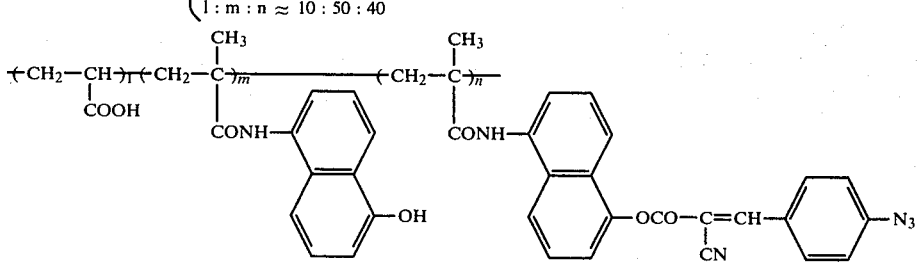
(13)

For the synthesis of the present polymer, there may be adopted a variety of processes. For instance, an α,β-unsaturated acid chloride or α,β-unsaturated acid anhydride is allowed to react (if necessary, in the presence of a basic catalyst) with a primary or secondary amine having a phenolic hydroxyl group to prepare a monomer having a structure corresponding to that having the aforementioned structural unit of the general formula (I) into which the hydroxyl group has been introduced in place of the —OCO—C(CN)=CH—Z—N₃ group. Thereafter, the monomer thus prepared is homopolymerized according to an ordinary procedure or copolymerized with at least one vinyl monomer to obtain a polymer having a phenolic hydroxyl group. The polymer thus obtained is allowed to react (in an organic solvent miscible with water in the presence of an alkali) with an acid chloride of the general formula (II):

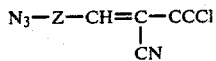

(wherein Z is as defined before), thereby esterifying a part of the phenolic hydroxyl group. Alternatively, said polymer having a phenolic hydroxyl group is allowed to react (in the presence of a tertiary amine, for example, such as pyridine or triethylamine, used as a basic catalyst,) with an acid chloride of the aforementioned general formula (II), thereby esterifying a part of the phenolic hydroxyl group. In this manner, there may be obtained the present polymer. In the above-mentioned synthesis process, molecular weights of the polymer of the present invention may relatively easily be controlled over a wide range by suitably selecting such reaction conditions as the temperature employed at the time when the polymerization reaction is carried out, the kind of the reaction medium used and the amount of the polymerization initiator used. Further, in the case the acid chloride of the aforementioned general formula (II) is allowed to undergo a condensation reaction, the mole content of the structural unit if the aforementioned general formula (I) in the resulting high molecular compound of the present invention may optionally be controlled by varying an amount of the acid chloride of the aforementioned general formula (II), the kind and amount of the reaction medium used.

In the manner explained above, the polymer of the present invention may be obtained as those which optionally have widely ranging values of the molecular weight and mole content of the structural unit of the aforementioned general formula (I). In order to effectively carry out the purposes of the present invention by use of the present high molecular compounds, however, the molecular weight of the present compound and the mole content of the structural unit of the aforementioned general formula (I) thereof are desirably about 2,000 to about 1,000,000 and not less than 10 mole%, respectively.

By virtue of incorporating into the structure of the high molecular compound of the present invention an appropriate amount of an alkali-soluble component having such an alkali-soluble group as a carboxylic acid, a sulfonic acid or a phenolic hydroxyl group, it becomes possible that a photosensitive composition in which the present polymer having such alkali-soluble component has been used may be subjected to development by the use of an aqueous solution.

Representatives of the polymer of the present invention are illustrated below with reference to synthesis examples.

SYNTHESIS EXAMPLE 1

Preparation of compound (1)

A mixture comprising 400 g of p-hydroxyaniline, 4 g of hydroquinone monomethyl ether, 4 g of acetone and 360 g of pyridine was externally cooled by the use of a coolant, and thereto was dropwise added with stirring 420 g of methacrylic acid chloride at the time when the internal temperature of the mixture reduced to −10° C. The speed of addition of the methacrylic acid chloride was controlled so that the reaction temperature may be maintained at a temperature below 0° C. and, after completion of the addition, the resulting mixture was stirred at 0° to 3° C. for about 2 hours, followed by stirring at 25° C. for 2 hours. Thereafter, the reaction liquid was concentrated to about ⅓ of the original volume, the concentrated reaction liquid was poured into 10 liters of dilute hydrochloric acid (pH about 1.0), the precipitate was filtered by suction to obtain white solids. The white solids were dissolved by heating in 2 liters of methanol, the resulting solution was further charged with 2 liters of a 5% sodium carbonate solution, and the resultant mixed solution was stirred at 40° C. for 30 minutes to obtain a dark red solution.

Subsequently, this dark red solution was poured into 8 liters of a 5% aqueous hydrochloric acid solution to form a large amount of precipitate, the precipitate was filtered by suction and dried to obtain pale pink solids. The pale pink solids were recrystallized from a mixed solvent of ethanol and water to obtain 450 g of white crystals of p-hydroxymethacrylanilide, m.p. 155°–156° C.

A solution of 124 g of p-hydroxymethacrylanilide obtained in the above manner, 1.149 g of α,α′-azobisisobutyronitrile and 1.416 g of dodecylmercaptan in 350 ml of a 1:1 mixture of acetone and methanol was heated at 65° C. for 30 hours in a sealed tube filled with nitrogen gas to obtain a polymer solution. This polymer solution was poured into water, the white precipitate was filtered and then dried to obtain 101 g of a white polymer (A).

The molecular weight of this polymer (A) as measured according to the osmotic pressure method was about 23000.

In a mixture comprising 400 ml of dry pyridine and 60 ml of γ-butyrolactone was completely dissolved 30 g of this white polymer (A), the solution was maintained at 50° C. and charged with 9.85 g of p-azido-α-cyanocinnamic acid chloride in small portions. After completion of addition of said acid chloride, the mixture was allowed to undergo reaction at 50° C. for 5 hours, whereupon the reaction mixture became a transparent pale yellow solution. This solution was allowed to stand overnight at room temperature and then poured into a mixture of 3 liters of iced water and 80 ml of concentrated hydrochloric acid to deposit a precipitate. The precipitate was filtered by suction, water-washed and then dried to obtain 35 g of compound (1).

SYNTHESIS EXAMPLE 2

Preparation of compound (2)

A mixture comprising 104 g of m-hydroxyaniline, 0.5 g of hydroquinone monomethyl ether, 170 g of methacrylic anhydride and 200 ml of water was allowed to undergo reaction at 70° C. for 2 hours and then cooled. The precipitate formed by adding 500 ml of a 5% hydrochloric acid to the reaction liquid was filtered by suction to obtain white solids. After dissolving, by heating, the white solids in 500 ml of methanol, the resulting solution was stirred together with 500 ml of a 5% aqueous sodium carbonate solution at 40° C. for 30 minutes. Thereafter, the resulting mixture was poured into 2 liters of a 5% hydrochloric acid to form a large amount of precipitate. The precipitate thus formed was filtered by suction and then recrystallized from ethanol to obtain 130 g of white crystals of m-hydroxymethacrylanilide, m.p. 171°–173° C.

A solution of 124 g of m-hydroxymethacrylanilide obtained above and 1.15 g of α,α'-azobisisobutyronitrile in 350 ml of a 1:1 mixture of acetone and methanol was heated at 65° C. for 30 hours in a nitrogen gas-filled and sealed tube to obtain a polymer solution. After diluting this polymer solution with 200 ml of a 1:1 mixture of methanol and acetone, the polymer solution was poured into water, the white precipitate was filtered and then dried to obtain 121 g of a polymer (B). The molecular weight of this polymer (B) as measured according to the osmotic pressure method was about 45000.

Into a solution of 30 g of this white polymer (B) and 15.8 g of p-azido-α-cyanocinnamic acid chloride in a mixture comprising 600 ml of tetrahydrofuran and 20 ml of water, was dropwise added with stirring at 40° C. 120 ml of 1N sodium carbonate solution. After completion of the addition, the reaction liquid was poured, after stirring for 30 minutes, into 3 liters of dilute hydrochloric acid to form a precipitate. The precipitate was filtered by suction, water-washed and then dried to obtain 41 g of compound (2).

SYNTHESIS EXAMPLE 3

Preparation of compound (4)

A solution of 141.6 g (0.8 mole) p-hydroxymethacrylanilide obtained in Synthesis Example 1, 17.2 g (0.2 mole) of methacrylic acid and 1.64 g of α,α'-azobisisobutyronitrile in 350 ml of a 1:1 mixture of acetone and methanol was heated at 65° C. for 30 hours in a nitrogen gas-filled and sealed tube to obtain a copolymer solution. After diluting 100 ml of methanol, this copolymer solution was poured into water to form a precipitate. The precipitate was filtered and then dried to obtain 130 g of a copolymer (C). The molecular weight of this copolymer (C) as measured according to the osmotic pressure method was about 38000.

Into a solution of 10 g of this copolymer (C) completely dissolved in 130 ml of dry pyridine and maintained at 50° C. was added with stirring 7.9 g of m-azido-α-cyanocinnamic acid chloride in small portions. After completion of the addition, the mixture was allowed to undergo the reaction at 55° C. for 5 hours. After allowing to stand overnight at a room temperature, the reaction mixture was then poured into 3 liters of cooled dilute hydrochloric acid to form a precipitate. The precipitate was filtered by suction, water-washed and then dried to obtain 15.8 g of compound (4).

SYNTHESIS EXAMPLE 4

Preparation of compound (13)

Into a mixture comprising 227 g of 5-amino-α-naphthol, 1 g of hydroquinone monomethyl ether and 2 liters of pyridine was dropwise added with stirring 110 g of methacrylic acid chloride cooled to −10° C. by the use of a coolant. After completion of the addition, the mixture was stirred at 0°–3° C. for 2 hours, followed by stirring at 25° C. for 2 hours. Thereafter, the reaction liquid was poured into 20 liters of water to form a precipitate which was then filtered, water-washed and then dried to obtain solids. The solids were added to 2 liters of a 1:1 mixture of methanol and a 5% sodium carbonate solution, and after stirring at 40° C. the mixture was poured into 4 liters of a 5% hydrochloric acid to form a large amount of precipitate. The precipitate was filtered by suction and then recrystallized from ethanol to obtain 210 g of N-(5-hydroxy-α-naphthyl)methacrylamide, m.p. 223°–224° C.

A solution of 182 g (0.8 mole) of N-(5-hydroxy-α-naphthyl)methacrylamide, 14.4 g (0.2 mole) of acrylic acid, 1.64 g of α,α'-azobisisobutyronitrile and 2.02 g of dodecylmercaptol in 600 ml of a 1:1 mixture of acetone and methanol was heated at 55° C. for 40 hours in a nitrogen gas-filled tube to obtain a copolymer solution.

After diluting with 200 ml of methanol, this copolymer solution was poured into water to form a precipitate which was then filtered and dried to obtain 192 g of a copolymer (D). The molecular weight of this copolymer (D) as measured according to the osmotic pressure method was about 19000.

Into a solution of 30 g of this copolymer (D) in a mixture of 400 ml of dry pyridine and 100 ml of γ-butyrolacetone and maintained at 50° C. was added 11.8 g of p-azido-α-cyanocinnamic acid chloride in small portions. After completion of the addition, the mixture was allowed to undergo the reaction at 50° C. for 5 hours and the reaction mixture was then poured into a mixture of 4 liters of iced water and 80 ml of a concentrated hydrochloric acid to form a precipitate. The precipitate was filtered by suction, water-washed and then dried to obtain 38 g of compound (13).

The polymer of the present invention synthesized in the manner explained above have excellent photosensitivity and hence it is necessary to store them in a dark place. When stored in a dark place the present high molecular compounds are able to stand a long term storage without suffering from decomposition and, at the same time, are less in hygroscopicity without deteriorating characteristic properties required for photosensitive materials.

The present invention relates to a photosensitive composition which contains as a photosensitive component at least one polymer having excellent photosensitivity according to the invention as explained hereinbefore. The polymer of the present invention is a resin having a high molecular weight and hence is, per se, excellent in film-forming property and is free from deposition of crystal and also excellent in storage stability as well as in adhesivity. Thus, a favorable photosensitive composition can be obtained even when the present high molecular compound is dissolved alone in an organic solvent. In order to improve the present composition in coating property and developability, other resins may be used in mixture. For instance, where the photosensitive composition is intended to be subjected to alkali development treatment, alkali-soluble resins may be mixed with the present high molecular compound used in said composition. Such alkali-soluble resins include, for example, natural resins such as shellac and rosin; novollac resins such as a phenol formalin novollac resin and an m-cresol formalin novollac resin; homopolymers or copolymers, of unsaturated carboxylic acids, such as a polyacrylic acid, a polymethacrylic acid, a methacrylic acid-styrene copolymer, a methacrylic acid-methyl acrylate copolymer, a maleic anhydride-vinyl compound copolymer, an acrylic acid-vinyl compound copolymer and a methacrylic acid-vinyl compound copolymer; such resins as obtained by partially acetalating partial or complete saponification products of polyvinylacetate with aldehydes such as acetaldehyde, benzaldehyde, hydroxybenzaldehyde and carboxybenzaldehyde; and homopolymers of monomers corresponding to those as having introduced into the structural unit of the aforementioned general formula (I) a hydroxyl group in place of the —C—CO—C(CN)=CH—Z—N$_3$ group or copolymers thereof with other vinyl monomers. Further, the polymer of the present invention may be incorporated, if necessary, with resins soluble in organic solvents, which resins include, for example, cellulose alkyl ethers such as cellulose methyl ether and cellulose ethyl ether. Because of excellent compatibility with these resins, the present polymer may be advantageously used in combination therewith. Particularly, cellulose alkyl ethers are effective in improving coating property, by incorporating in a small amount into the present photosensitive composition and give good results even when the present photosensitive composition is subjected to an alkali development treatment. The photosensitive compositions according to the present invention may be incorporated with known azide compounds such as 1-azide pyrene and 4,4'-diazidochalcone as photosensitive components in addition to the present polymer, and further may be incorporated with various kinds of other additives. For instance, the present polymer may be incorporated with dyes such as acridine, cyanine, merocyanine, styryl and triphenylmethane dyes or pigments, which are used as coloring materials to make images visible. Similarly, photochromogenic substances or photoversicolor substances may also be used for the purpose of visualizing images by exposure to light. Such photochromogenic substances or photoversicolor substances include, for example, combinations of aromatic azides, carbonyl azide or sulfonyl azides with leuco dyes. The amount of such substance to be added may vary depending on the degree of visualization of image. Generally, however, the amount of such the substance added is sufficiently 0.01 to 0.1 time, in weight, of the present polymer which is the photosensitive component in the photosensitive composition. The same amount may be applied as to the above-mentioned dyes. Further, the aforementioned alkali-soluble resins, resins soluble in organic solvents or other azide compounds may be incorporated into the present photosensitive composition in an amount of about 0.1 to 10 times as much as the weight of the present high molecular compound present in the composition.

The photosensitive composition according to the present invention may be incorporated with plasticizers which are excellent in compatibility with the present high molecular compound present in the composition. For instance, such plasticizers as phthalate esters, phosphate esters, esters of aliphatic carboxylic acids, glycol derivatives and sulfonamides are quite useful for the present polymer. When such plasticizers are incorporated into the present photosensitive composition, not only pliability is imparted to a photosensitive layer of the resulting photosensitive composition and thereby to increase extensibility thereof but also coating property is improved when the photosensitive layer is formed on a support and thereby to improve markedly said layer in film-forming property. Further, adhesion of the photosensitive layer to a support, for example, an aluminum plate, is markedly improved. Moreover, when the resulting photosensitive composition is coated on a support and then used as a printing plate, a line drawing portion of the photosensitive layer at the time of a development treatment is prevented from swelling and thus relief strength of the line drawing portion is markedly enhanced. The plasticizers used in the present invention have such effects that a treatment latitude of the development may be expanded, unevenness in finishing can be eliminated, uneven treatment at the time of development and undesirable adherence of ink to the non-line drawing portion can be prevented and further the line drawing portion may be improved in ink-receptivity.

The amount of the plasticizer used in the present photosensitive composition is generally 0.05 to 0.5, preferably 0.15 to 0.25, time, in weight, of the present polymer present in the composition.

Furthermore, the photosensitive composition according to the present invention can also be incorporated with sensitizers for the purpose of improving sensitivity or photosensitive wavelength region of the composition. Suitable sensitizers are, for example, Michler's ketone, 9-fluorenone, 1-nitropyrene, 1,8-dinitropyrene, 2-chloro-1,2-benzanthraquinone, pyrene-1,6-quinone, anthanthrone, 2-chloro-1,8-phthaloylnaphthalene and cyanoacridine. The amount of the sensitizer present in the photosensitive composition is preferably 0.1 to 2.0 parts by weight based on 100 parts by weight of the aromatic azide compound contained in the composition.

The photosensitive composition according to the present invention is coated, followed by drying, on a suitable support such as an aluminum plate, zinc plate, copper plate, plastic film, paper or laminated plate, e.g. bimetal or trimetal, and the composition thus supported is used for various purposes. In the above case, a coating solution used for coating the present photosensitive composition on the support desirably contains the total solids of said composition in a concentration ranging from 0.1 to 50% by weight based on an organic solvent in the coating liquid. Suitable organic solvents used in this case include methyl cellosolve, ethyl cellosolve, dioxane, acetone, cyclohexanone, γ-butyrolactone, tetrachloroethane, tetrahydrofuran, dimethylsulfoxide, dimethylformamide and methyl cellosolve acetate. The photosensitive composition according to the present invention is quite stable and able to stand a long term storage in a dark place, and a photosensitive material obtained by coating said composition on a support, followed by drying, may also be able to stand a several-month storage in a dark place.

When using the above-mentioned photosensitive material, any procedures conventionally adopted may be applicable thereto. For instance, an original having a line or halftone image is brought into close contact with a photosensitive layer surface of a photosensitive material and the material is exposed to light. The exposed material is then developed with an aqueous alkaline solution or organic solvent to obtain a negative type relief image corresponding to the original on the material. Preferably usable as light sources for the exposure, are an carbon arc lamp, a mercury lamp, a xenone lamp, a chemical lamp and a photographic flash lamp. The aqueous alkaline solution used in the development is an aqueous solution of sodium hydroxide, potassium hydroxide, sodium carbonate, potassium carbonate, sodium bicarbonate, potassium bicarbonate, sodium metasilicate, sodium secondary phosphate or sodium tertiary phosphate. For the purpose of preventing a developer solution from fatigue, there may be used an alkaline buffer or, according to circumstances, such aliphatic amine, for example, as mono-, di- or trihydroxyethylamine or mono-, di- or triethylamine. The concentration of an aqueous alkaline solution used in this case may vary depending on the kind of the photosensitive composition and alkaline to be employed, however, the concentration ranging from 0.1 to 10% by weight is generally suitable. With the view of accelerating development and of preventing an uneven treatment, a small amount of a surface active agent or organic solvent miscible with water may be incorporated into a developer solution. The organic solvent usable effectively in developing the exposed photosensitive material includes methanol, ethanol, acetone, benzene, toluene, acetonitrile, methyl cellosolve, ethyl cellosolve, dioxane, tetrahydrofuran, methyl cellosolve acetate, methyl ethyl ketone, cyclohexanone, triclene, γ-butyrolactone, dimethylsulfoxide, dimethylformamide, ethylacetate, butyl acetate and the mixtures thereof. When an organic solvent miscible with water is used or when a small amount of a surface active agent is incorporated into a developer solution with the view of preventing a relief image from swelling as well as of preventing the occurrence of uneven treatment, the incorporation of a small amount of water thereinto gives favorable results.

The relief image thus obtained is high in chemical resistance and has a strong resistance to such etching solution as nitric acid or ferric chloride, and hence is suitable for use in relief printing, intaglio printing and name plates or substrates for printed circuits. In addition, the relief image is useful for lithographic plate such as presensitized plate since the image is excellent in oil suspectivity, high in mechanical strength strong in adhesion to a substrate. Moreover, the relief image is high in resistance to printing and can stand the printing of a large number of prints.

The photosensitive composition according to the present invention is excellent in film-forming property without suffering from crystal deposition, excellent in preservation stability, and high in sensitivity because of a quite large difference in solubility not only to an aqueous alkali solution but also to an organic solvent between the exposed and unexposed portions due to a light exposure, and thus gives a favorable relief image. Moreover, the polymer of the present invention can be synthesized while relatively easily regulating the molecular weight or content of the structural units having photosensitive groups, and hence may be obtained suitably according to the purpose for which the photosensitive composition comprising the same is used. Further, a photosensitive material obtained by the use of the present photosensitive polymer is high in development latitude and in sensitivity and, moreover, a relief image obtained by the use of the photosensitive material is excellent in such properties as resistance to printing, resistance to abrasion, adhesion to a support and chemical resistance and hence can be effectively used for various purposes.

In the manner as explained above, the photosensitive compositions are of commercial usefulness.

The present invention is illustrated below with reference to examples, but embodiments of the invention are not intended to be limited only thereto.

EXAMPLE 1

A solution of 40 g of compound (1) obtained in Synthesis Example 1 in 800 ml of methyl cellosolve was coated by means of a coating machine on a grained aluminum plate and then dried. A negative original of a line and halftone photograph was placed in contact with the photosensitive surface of the thus obtained photosensitive plate and exposed for 3 minutes to light at the distance of 1 m from a 3 KW mercury lamp. The exposed plate was immersed for 1 minute in a 3% aqueous sodium metasilicate solution and, thereafter, the exposed surface of the plate was softly rubbed with absorbent cotton, whereupon the unexposed portion was removed and a positive relief image excellent in oil-suspectivity was obtained. After imparting water-retainability by means of moistening water to the relief image, the plate was subjected to an offset press, whereby many prints, each having the image of good quality, were obtained.

EXAMPLE 2

A solution of 10 g of compound (2) obtained in Synthesis Example 2, 0.7 g of 5-nitroacenaphthene, 400 g of cellulose ethyl ether and 100 mg of a triphenylmethane type dye (Victoria Pure Blue BOH, produced and sold by Hodogaya Kagaku K. K.) in 100 ml of a 2:8 mixture of dimethylformamide and methyl cellosolve was coated by means of a coating machine on a polished surface of printing zinc plate and then dried. A transparent film original was placed in contact with the photosensitive surface of the thus obtained photosensitive plate, and the resulting unit was set in a vacuum printing machine and exposed for about 1 minute at the distance of about 40 cm to light from a carbon arc lamp. The exposed plate was then developed with a 1% aqueous sodium hydroxide solution and the unexposed portion was removed to obtain a blue negative relief image high in acid resistance correspondingly to the original, followed by etching with an ordinary Dow etching solution and water-washing. The resultant plate was subjected to a letterpress printing machine to obtain many prints having a sharp bordered print image.

EXAMPLE 3

A solution of 5 g of compound (2) obtained in Synthesis Example 2, 0.3 g of Michler's ketone, 150 mg of cellulose ethyl ether and 1 g of N-butylpyrrolidone in 100 ml of methyl cellosolve was coated on a grained aluminum plate by a coating machine and then dried. A negative original of line drawing and halftone photographs was placed in contact with the photosensitive surface of the thus obtained photosensitive plate, and the resulting unit was exposed for 5 minutes to light from a chemical lamp. The exposed plate was developed with a 6% aqueous sodium metasilicate solution, whereby the unexposed portion was removed to obtain a positive relief image. Subsequently, the resultant plate was treated on the surface with a 1% aqueous phosphate solution and then subjected to an offset press to obtain many prints having the corresponding image of good quality.

EXAMPLE 4

A solution of 10 g of compound (4) prepared in Synthesis Example 3, 3 g of formalin novellac resin and 60 mg of a triphenylmethane type dye (Victoria Blue Base F.4.R, produced and sold by BASF Co.) was coated on an ordinary print substrate (a plate prepared by laminating a copper foil on a support such as bakelite plate, phenol paper or epoxy paper) and then dried. The thus obtained photosensitive plate was brought into contact on the photosensitive surface with a transparent negative film original, set in a vacuum printing machine, and then exposed for 2 minutes at the distance of about 90 cm to light from a 3KW mercury lamp, followed by developing for 1 minute with an aqueous solution containing 5% by weight of sodium tertiary phosphate and 3% by weight of isopropyl alcohol and then drying to obtain on the plate a positive relief image. Subsequently, the thus treated plate was etched by immersing it into an aqueous solution of 40% by weight of ferric chloride and, thereafter, the relief image was dissolved and removed by the use of γ-butyrolactone to obtain a favorable printed circuit board.

EXAMPLE 5

A solution of 10 g of compound (13) prepared in Synthesis Example 4, 0.5 g of 2-nitrofluorene, 2 g of naphthoquinone-1,2-diazido-2,5-sulfonazide, 1 g of tricresyl phosphate and 200 mg of 2-(p-dimethylaminostyryl)benzthiazole in a 1:3 mixture of γ-butyrolactone and cyclohexanone was coated on a rough surfaced aluminum plate and then dried. The thus obtained photosensitive plate was brought into contact on the photosensitive surface with a negative transparent film original, set in a vacuum printing machine and then exposed for 2 minutes to light from a 500 W tungsten lamp to obtain a dark red and sharp image. The image was then developed with a 10:4 mixture of methyl cellosolve and γ-butyrolactone to obtain a positive relief image excellent in oil-suspectivity and mechanical strength. The plate having thus obtained positive relief image was subjected to an offset press to obtain many prints having the corresponding image of good quality.

EXAMPLE 6

A solution of 7 g of compound (13) prepared in Synthesis Example 4, 500 mg of Victoria Pure Blue BOH and 50 mg of cellulose ethyl ether in 100 ml of a 1:1 mixture of dimethylformamide and cyclohexanone was coated on a polyester base and then dried. The thus obtained photosensitive film was brought into contact on the photosensitive surface with a negative original and then exposed for 4 minutes at the distance of 1 meter to light from a 3KW mercury lamp, followed by developing with a 8% aqueous sodium tertiary phosphate solution to obtain a blue and sharp positive image. The plate having the thus obtained positive image was found to be a useful wash off film for various art techniques including proof, a title place for color TV, a title of motion picture, phototypesetting, instant lettering, typetone and screentone.

What we claim is:

1. A photosensitive composition containing as active ingredient a polymer which has, in the molecular structure, a structural unit represented by the general formula (I):

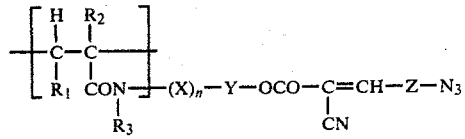

wherein $R_1$ represents hydrogen, an alkyl group or carboxyl; $R_2$ represents hydrogen, halogen or an alkyl group; $R_3$ represents hydrogen, an alkyl group, an aryl group or an aralkyl group; Y and Z individually represent an arylene group; X represents a divalent organic group connecting the adjacent nitrogen atom and the aromatic ring carbon atom of Y; and n represents 0 or 1, the structural unit of said polymer being present in said polymer in an amount not less than 10 mole percent and said polymer having a molecular weight of from about 2,000 to about 1,000,000.

2. A photosensitive composition according to claim 1 wherein the aryl group and the aralkyl group in $R_3$ are respectively phenyl and benzyl.

3. A photosensitive composition according to claim 1 wherein the arylene group for Y and Z is selected from a phenylene group and a naphthylene group.

4. A photosensitive composition according to claim 3 wherein the phenylene group is phenylene while the naphthylene group is naphthylene.

5. A photosensitive composition according to claim 1 wherein the alkyl group for $R_1$ is methyl.

6. A photosensitive composition according to claim 1 wherein the halogen for $R_2$ is chlorine or bromine while the alkyl for $R_2$ and $R_3$ is methyl or ethyl.

7. A photosensitive composition according to claim 1 wherein the divalent group for X is an alkylene group.

8. A photosensitive composition according to claim 7 wherein the alkylene group for X is methylene or ethylene.

9. A photosensitive composition according to claim 1 wherein the divalent group for X is selected from

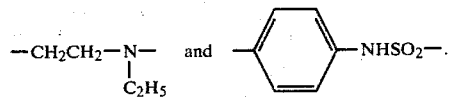

10. A photosensitive composition according to claim 3 wherein the phenylene group for Y is cyano, methyl and/or methoxy substituted phenylene and Z is phenylene or naphthylene substituted with nitro and/or chlorine.

11. A photosensitive composition according to claim 1 wherein the composition further contains 1-azidopyrene.

12. A photosensitive composition according to claim 1 wherein the composition further contains cellulose methyl ether and/or cellulose ethyl ether.

13. A photosensitive composition according to claim 1 wherein Y is naphthalene substituted with a sulfonic acid.

* * * * *